United States Patent
Ngu et al.

(10) Patent No.: US 11,322,497 B1
(45) Date of Patent: May 3, 2022

(54) ELECTRONIC FUSE (E-FUSE) CELLS INTEGRATED WITH BIPOLAR DEVICE

(71) Applicant: GLOBALFOUNDRIES U.S. Inc., Santa Clara, CA (US)

(72) Inventors: Yves T. Ngu, Williston, VT (US); Ephrem G. Gebreselasie, South Burlington, VT (US); Vibhor Jain, Williston, VT (US); Johnatan A. Kantarovsky, South Burlington, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/172,539

(22) Filed: Feb. 10, 2021

(51) Int. Cl.
*H01L 27/102* (2006.01)
*H01L 23/525* (2006.01)
*H01L 23/62* (2006.01)

(52) U.S. Cl.
CPC ...... *H01L 27/1026* (2013.01); *H01L 23/5256* (2013.01); *H01L 23/62* (2013.01)

(58) Field of Classification Search
CPC .. H01L 27/1026; H01L 23/5256; H01L 23/62
USPC ........................................................ 257/529
See application file for complete search history.

(56) References Cited

U.S. PATENT DOCUMENTS

| | | | |
|---|---|---|---|
| 5,436,496 A * | 7/1995 | Jerome | H01L 23/5256 257/529 |
| 5,661,323 A | 8/1997 | Choi et al. | |
| 7,575,958 B2 * | 8/2009 | Hoefler | H01L 23/5256 438/132 |
| 7,960,809 B2 | 6/2011 | Kothandaraman et al. | |
| 8,299,570 B2 | 10/2012 | Kim et al. | |
| 8,842,488 B2 | 9/2014 | Rountree | |
| 10,438,956 B2 | 10/2019 | Balakrishnan et al. | |
| 10,923,204 B2 * | 2/2021 | Chung | G11C 29/027 |
| 2008/0169529 A1 | 7/2008 | Kim et al. | |
| 2010/0181643 A1 | 7/2010 | Kothandaraman et al. | |
| 2017/0005036 A1 * | 1/2017 | Kodama | H01L 21/02595 |
| 2017/0133101 A9 | 5/2017 | Chung | |

* cited by examiner

*Primary Examiner* — David Vu
*Assistant Examiner* — Brandon C Fox
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to electronic fuse (e-fuse) cells integrated with a bipolar device and methods of manufacture. The structure includes: a bipolar device comprising a collector region, a base region and an emitter region; and an e-fuse integrated with and extending from the emitter region of the bipolar device.

19 Claims, 8 Drawing Sheets

FIG. 6

ELECTRONIC FUSE (E-FUSE) CELLS INTEGRATED WITH BIPOLAR DEVICE

FIELD OF THE INVENTION

The present disclosure relates to semiconductor structures and, more particularly, to electronic fuse (e-fuse) cells integrated with a bipolar device and methods of manufacture.

BACKGROUND

In computing, an electronic fuse (e-fuse) is a microscopic fuse put into a computer chip. This technology allows for the dynamic real-time reprogramming of chips, i.e., integrated circuits. Generally, computer logic is generally "etched" or "hard-coded" onto a chip and cannot be changed after the chip has been manufactured. By utilizing a set of e-fuses, through, a chip manufacturer can program the circuits on a chip while it is in operation.

E-fuses can be made from silicon or metal traces, as examples. In both cases, they work (blow) by electromigration, i.e., the phenomenon that electric flow causes the conductor material to move and blow the fuse. Although electromigration is generally undesired in chip design as it causes failures, e-fuses are made of weak traces that are designed to fail before it causes failures in other circuits of the integrated circuit. However, e-fuses suffer from footprint challenges and typically need a CMOS programming current source in BiCMOS technology.

SUMMARY

In an aspect of the disclosure, a structure comprises: a bipolar device comprising a collector region, a base region and an emitter region; and an e-fuse integrated with and extending from the emitter region of the bipolar device.

In an aspect of the disclosure, a structure comprises: a bipolar transistor comprising a collector region, a base region and emitter region, the emitter region comprising a central silicided region substantially narrower than end regions; a first interconnect connecting to a first of the end regions; and a second interconnect connecting a second of the end regions.

In an aspect of the disclosure, a method comprises: forming a bipolar device comprising a collector region, a base region and an emitter region; and forming an e-fuse integrated with and extending from the emitter region of the bipolar device.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to electronic fuse (e-fuse) cells integrated with a bipolar device and methods of manufacture. More specifically, the e-fuse cell includes a fuse-link integrated with a bipolar programming device in a single, integrated structure. For example, in embodiments, the e-fuse can be an extension of the emitter (e.g., polysilicon material) of a heterojunction bipolar transistor. Advantageously, the e-fuse cell provides considerable area savings (e.g., upwards of 25% reduction), with the capability of supporting more current than a conventional field effect transistor (FET) while also exhibiting lower leakage current (for non-programmed fuses).

In embodiments, a vertical bipolar structure includes a base region, a collector region and an emitter region, e.g., NPN emitter of a heterojunction bipolar transistor. The emitter region comprises a silicided polysilicon material that has an extension region structured as an e-fuse, where the bipolar device acts as the programming device. For example, the emitter region (emitter electrode) can be shaped as a "dog" bone (e.g., "I" shape) which comprises three connected regions, i.e., a center region connected to and being substantially narrower than two end regions. The two end regions can contain at least one local interconnect, with the narrower, center region of the silicided emitter serving as the fuse link. In embodiments, for example, the inner local interconnect can be used for sensing resistance and can be floating during programming; whereas, the outer local interconnect can be a biasing contact. The e-fuse and heterojunction bipolar transistor can be fabricated in bulk technology.

The integrated e-fuse cell of the present disclosure can be manufactured in a number of ways using a number of different tools. In general, though, the methodologies and tools are used to form structures with dimensions in the micrometer and nanometer scale. The methodologies, i.e., technologies, employed to manufacture the integrated e-fuse cell of the present disclosure have been adopted from integrated circuit (IC) technology. For example, the structures are built on wafers and are realized in films of material patterned by photolithographic processes on the top of a wafer. In particular, the fabrication of the integrated e-fuse cell uses three basic building blocks: (i) deposition of thin films of material on a substrate, (ii) applying a patterned mask on top of the films by photolithographic imaging, and (iii) etching the films selectively to the mask.

Figure 1A:
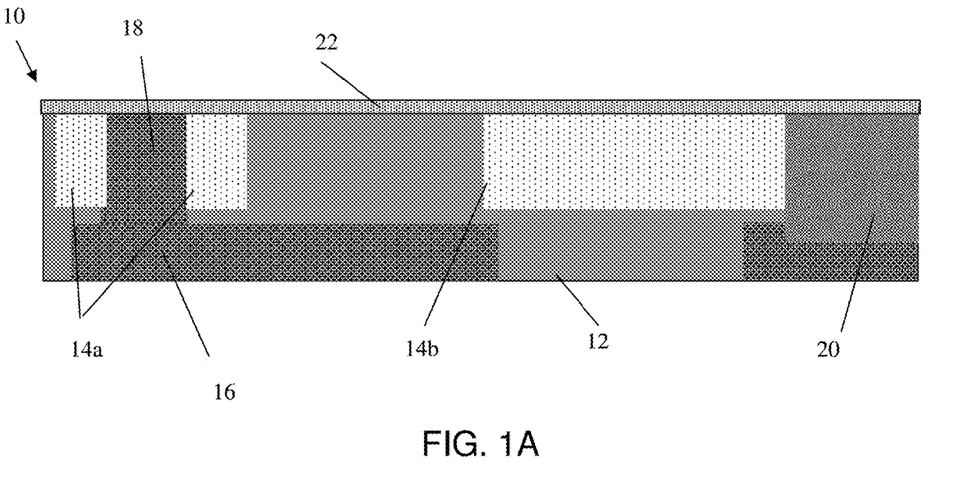
FIGS. 1A-1H show several structures and respective fabrication processes to build an e-fuse cell integrated with a bipolar device in accordance with aspects of the present disclosure.

FIG. 1A shows a beginning structure and respective fabrication processes in accordance with aspects of the present disclosure. In particular, FIG. 1A shows a structure 10 comprising a substrate 12 with shallow trench isolation structures 14a, 14b and a plurality of wells 16, 18, 20. In embodiments, the substrate 12 can be a bulk semiconductor material comprising a single semiconducting material such as bulk silicon. In further examples, the substrate 12 may be composed of any suitable material including, but not limited to, Si, SiGe, SiGeC, SiC, GaAs, InAs, InP, and other III/V or II/VI compound semiconductors.

A plurality of shallow trench isolation structures 14a, 14b extend into the substrate 12. In embodiments, the shallow trench isolation structure 14a can isolate a subcollector region from remaining portions of a heterojunction bipolar transistor, e.g., emitter region and base region; whereas, the shallow trench isolation structure 14b can isolate the heterojunction bipolar transistor from a CMOS transistor, e.g., p-FET.

In embodiments, the shallow trench isolation structures 14a, 14b can be formed by conventional lithography, etching and deposition methods known to those of skill in the art. For example, a resist formed over the substrate 12 is exposed to energy (light) to form a pattern (opening). An etching process with a selective chemistry, e.g., reactive ion etching (RIE), can be used to form one or more trenches in the substrate 12 through the openings of the resist. Following the resist removal by conventional oxygen ashing processes or other known stripants, insulator material (e.g., $SiO_2$) can be deposited within the trenches by any conventional deposition processes, e.g., chemical vapor deposition (CVD) processes. Any residual material on the surface of the substrate 12 can be removed by conventional chemical mechanical polishing (CMP) processes.

Still referring to FIG. 1A, a plurality of wells 16, 18, 20 can be formed in the substrate 12 by conventional ion implantation processes. In embodiments, the wells 16, 18 can be p-wells and the well 20 can be an n-well. In embodiments, the wells 16, 18 can be used as a subcollector region and contact to the collector region of the heterojunction bipolar transistor; whereas, the well 20 can be for a p-FET device. The n-well 20 can be doped with n-type dopants, e.g., Arsenic (As), Phosphorus (P) and Sb, among other suitable examples, and the p-wells 16, 18 can be doped with p-type dopants, e.g., boron.

In fabricating the wells 16, 18, 20, a dopant can be introduced by, for example, ion implantation processes. In the ion implantation processes, respective patterned implantation masks may be used to define different selected areas exposed for the implantations, e.g., wells 16, 18, 20. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

Still referring to FIG. 1A, a pad dielectric film 22 can be formed on the substrate 12 using conventional deposition processes. For example, the pad dielectric film 22 can be deposited by a conventional chemical vapor deposition (CVD) process. In embodiments, the pad dielectric film 22 can be a pad oxide or a combination of oxide, nitride and oxide materials as examples. The pad dielectric film 22 can be provided prior to the implantation processes in order to protect a surface of the substrate 12 during the implantation processes.

Figure 1B:
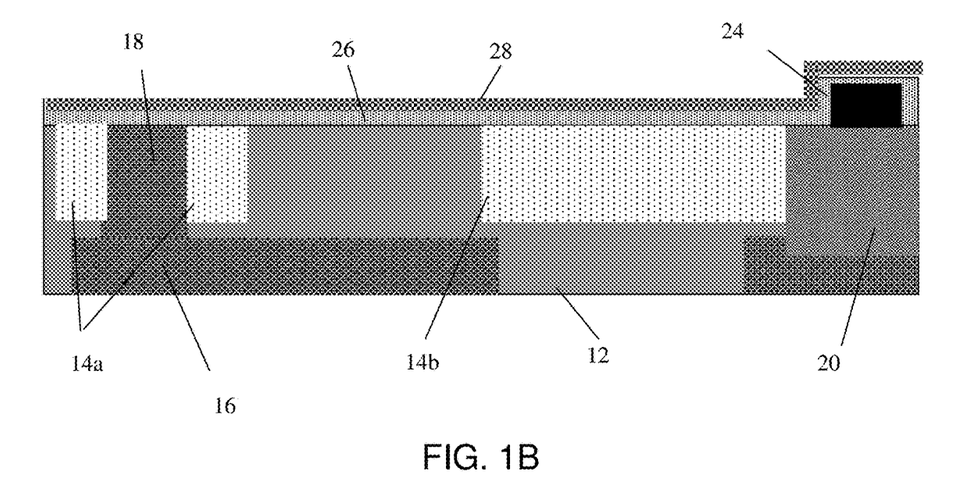

In FIG. 1B, a gate structure 24, e.g., transistor, can be formed over the well 20. In embodiments, the gate structure 24 can be fabricated using conventional CMOS processes as is known to those of ordinary skill in the art. For example, in the standard CMOS processing, a gate dielectric and polysilicon are formed, e.g., deposited, on the substrate 12, followed by a patterning process. An insulator material such as nitride and/or oxide can be deposited on the patterned materials followed by anisotropic etching processes to form sidewalls. Well implants, e.g., extension implants, can be formed in the well 20 adjacent to and underneath the sidewalls using conventional ion implantation processes.

Still referring to FIG. 1B, an oxide material 26 can be formed over the gate structure 24 and substrate 12, followed by a deposition of Si material 28. In embodiments, the oxide material 26 can be formed by a conventional thermal oxidation process to form a thin layer of oxide (e.g., $SiO_2$) on the surface of a substrate 12 and over the gate structure 24. The thermal oxidation process can be, for example, a conventional High Temperature Oxide (HTO) such as a rapid thermal chemical vapor deposition (RTCVD) process. The Si material 28 can be an amorphous polysilicon material, as an example.

Figure 1C:
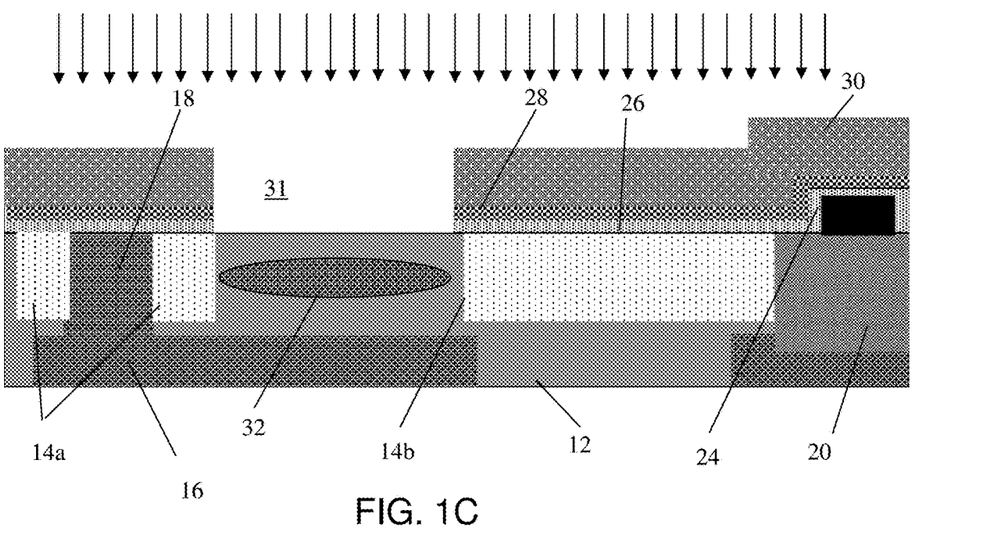

Referring now to FIG. 1C, a mask 30 can be formed over the Si material 28. The mask 30 can be patterned using conventional lithography and etching techniques to form an opening 31 between the shallow trench isolation structures 14a, 14b. In embodiments, the opening 31 can extend into the materials 26, 28 and be aligned with a collector region 32 of the heterojunction bipolar transistor. In embodiments, a thin layer of the oxide material 26 can remain over the substrate 12 during the ion implantation process that forms the collector region 32, in order to protect the surface of the substrate 12. The substrate 12 can then be subjected to an ion implantation process to form the collector region 32 between the shallow trench isolation structures 14a, 14b. As should be understood by those of skill in the art, for an NPN structure, the collector region 32 can be doped with n-type dopants, e.g., in a p-substrate 12.

Figure 1D:
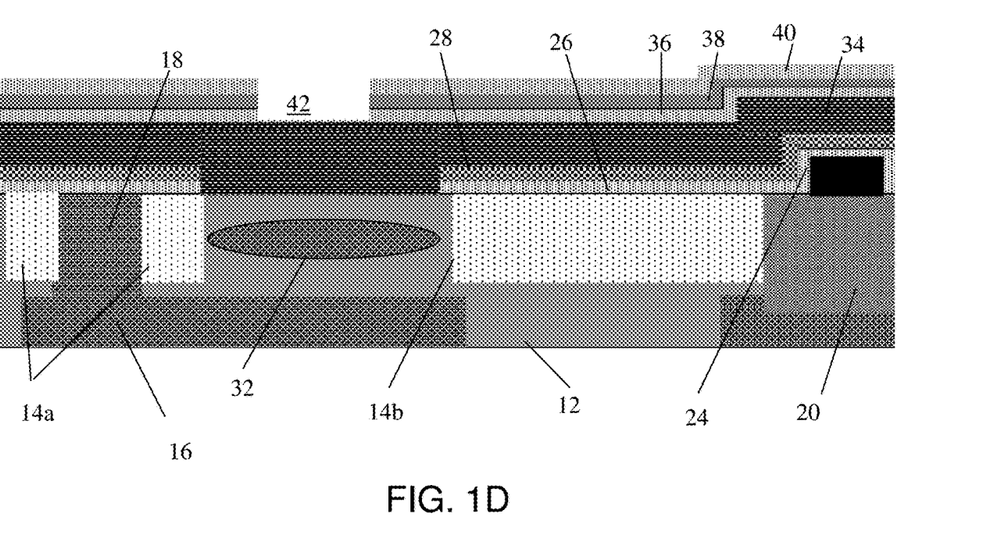

Referring to FIG. 1D, any residual oxide material 24 can be removed within the opening 31 to expose the underlying substrate 12. The mask can also be stripped using any conventional stripping method. A base material 34 can be formed, e.g., deposited, within the opening and over the material 28. In embodiments, the base material 34 can be an intrinsic p-type semiconductor material. For example, the base material 34 can be SiGe material that is deposited by an epitaxial process, e.g., low temperature epitaxial process.

A dielectric material 36 can be formed over the base material 34. The dielectric material 36 can be, e.g., oxide material, deposited using a conventional deposition method, e.g., CVD. A nitride material 38 and an oxide material 40 can be formed over the dielectric material 36. An opening 42 can be formed within the nitride material 38, oxide material 40, and dielectric material 36 to expose the underlying base material 34. In embodiments, the opening 42 can be aligned with the collector region 32, between the shallow trench isolation structures 14a, 14b.

Figure 1E:
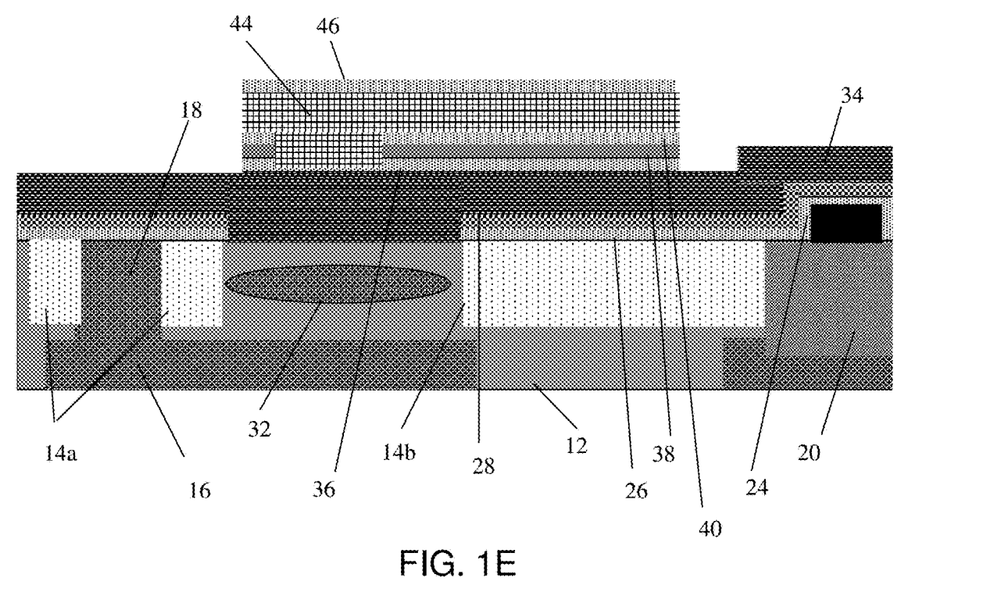

FIG. 1E shows an emitter material 44 formed within the opening 42 and over the oxide material 40. In embodiments, the emitter material 44 can be a polysilicon material. An insulator material 46, e.g., SiN, can formed over the emitter material 44. The materials 36, 38, 40, 44, 46 are patterned using conventional lithography and etching processes. The patterning process results in an "I" shaped emitter region (which is used as an e-fuse) as shown in FIG. 1F.

Figure 1F:
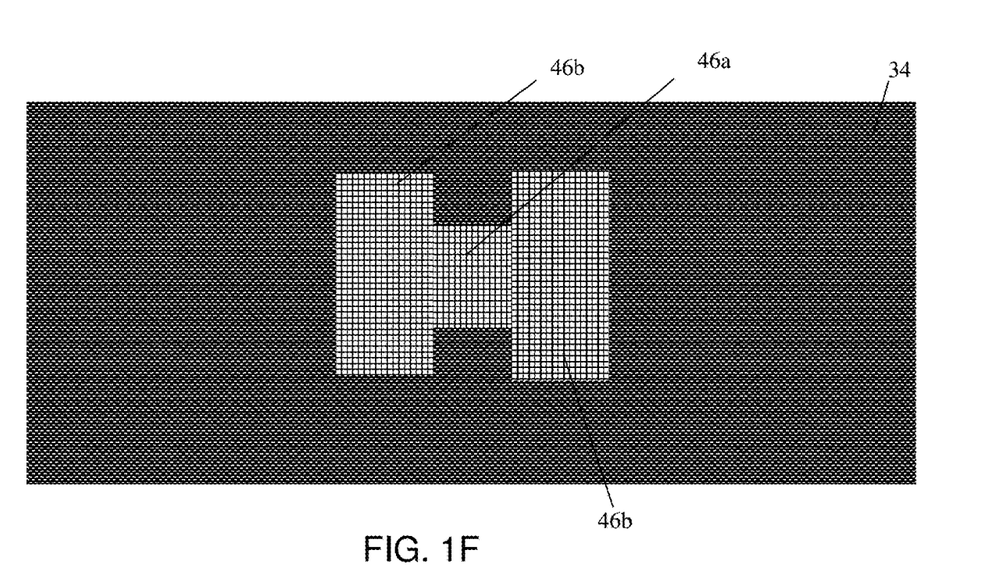

FIG. 1F shows a top view of the emitter region 46 of FIG. 1E. As shown in FIG. 1F, the "I" shaped emitter region 46 can be patterned to include a center region 46a and end regions 46b formed over the SiGe base material 34. The center region 46a can be substantially narrower than the end regions 46b in order to serve as a fuse link.

Figure 1G:
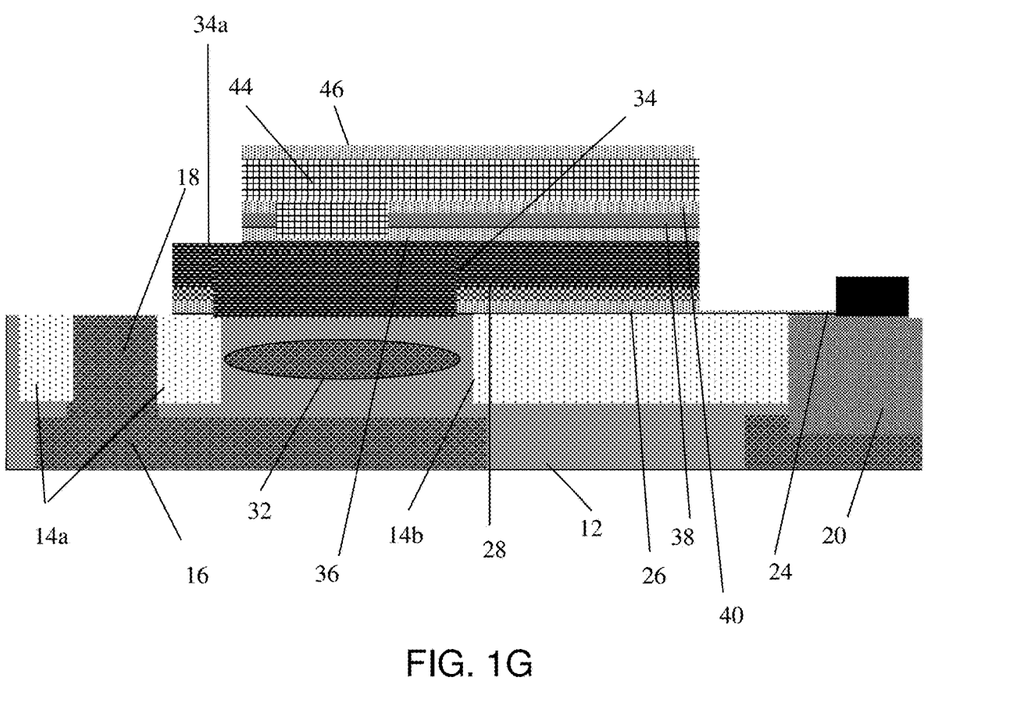

As shown in FIG. 1G, the base material 34 can be patterned to expose the well 18 (contact to the subcollector region) and the gate structure 24 (including source and drain regions). In addition, the base material 34 can be patterned to expose an extension 34a of the base material 34 (e.g., extrinsic base) for contact formation. The patterning of the base material 34 can be performed using conventional lithography and etching processes as already described herein such that no further explanation is required for a complete understanding of the present disclosure.

Figure 1H:
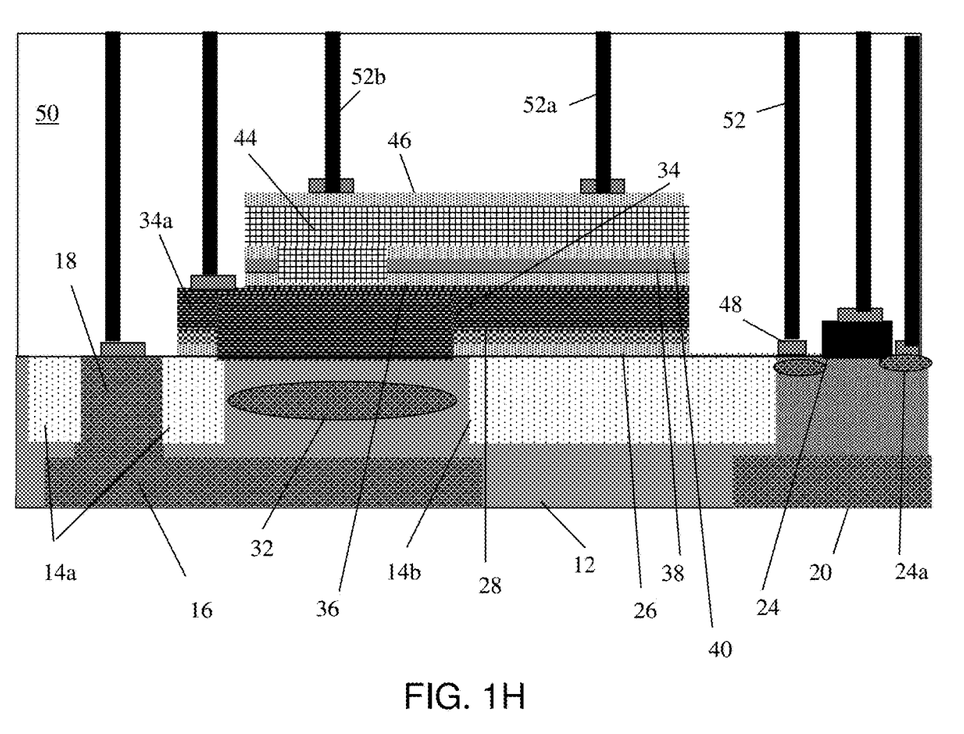

In FIG. 1H, source and drain regions 24a are formed in the n-well 20 using conventional ion implantation processes or epitaxial growth processes as is known in the art. In embodiments, the source/drain implants can also be added to the extrinsic base, e.g., extension 34a, of the e-fuse to obtain a lower on resistance.

Silicide contacts 48 are formed on active areas of the structure, e.g., source/drain regions 24a, gate structure 24, emitter region 46, subcollector region (e.g., well 18) and extension portion (extrinsic base) 34a of base region 34. And, as should be understood by those of skill in the art, the center region 46a of the "I" shaped emitter region 46 can also be silicided to server as the fuse link between the end regions 46b. In this way, the silicided center region 46a can be a lateral fuse link directly integrated with the emitter region 46, with a combination of the silicided center region 46a and the end regions 46b comprising the e-fuse laterally integrated with the emitter region 46.

As should be understood by those of skill in the art, the silicide process begins with deposition of a thin transition metal layer, e.g., nickel, cobalt or titanium, over fully formed and patterned semiconductor devices (e.g., doped or ion implanted source and drain regions, etc.). After deposition of the material, the structure is heated allowing the transition metal to react with exposed silicon (or other semiconductor material as described herein) in the active regions of the semiconductor device forming a low-resistance transition metal silicide. Following the reaction, any remaining transition metal can be removed by chemical etching, leaving silicide contacts 48 in the active regions of the device, in addition to the silicided fuse link, e.g., silicided center region 46a.

Still referring to FIG. 1H, an interlevel dielectric material 50 can be formed, e.g., deposited, over the structure using conventional deposition methods, e.g., CVD. In embodiments, the interlevel dielectric material 50 can be $SiO_2$. Contacts 52, 52a, 52b can be formed in the interlevel dielectric material 50 and contacting the silicided regions 48 (excluding the central region 46a which remains devoid of any contacts). In embodiments, the contacts 52a, 52b are formed in contact with the end portions of emitter region and, more specifically, as shown in FIGS. 2-6 the end regions 46b of the "I" shaped emitter region 46. In this way, the substantially narrower center region 46a (which is devoid of any contacts) can serve as a fuse link directly integrated with the emitter region 46, with a combination of the center region 46a and the end regions 46b (connected to contacts 52a, 52b) comprising the e-fuse laterally integrated with the emitter region 46.

In embodiments, for example, the inner local interconnect 52b can be used for sensing resistance and can be floating during programming; whereas, the outer local interconnect 52a can be a biasing contact to apply a current for blowing of the e-fuse. For example, the contacts 52a, 52b can be used to monitor link properties and sense post programming, and during programming, contact 52a can be biased while contact 52b floats.

FIGS. 2-6 show different configurations of the e-fuse cell 100 integrated with the heterojunction bipolar transistor. In each of the different configurations, the silicided center region 46a can be a lateral fuse link directly integrated with the emitter region 46 and, hence be a direct extension of the programming device, i.e., vertical heterojunction bipolar transistor. In this way, the e-fuse 100 can be a direct extension of an NPN emitter and programmed with the bipolar transistor.

Figure 2:
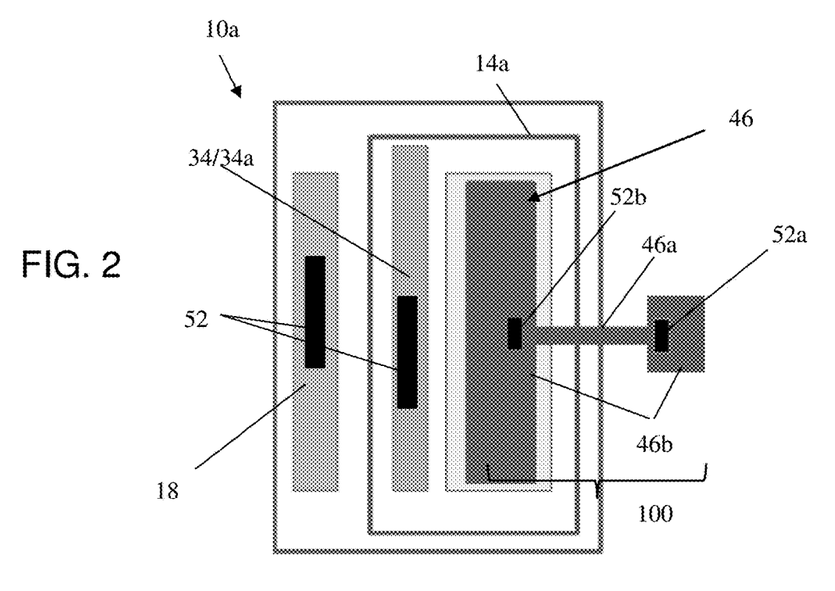
FIG. 2 shows a top view of the e-fuse cell shown in FIG. 1H.
Figure 3:
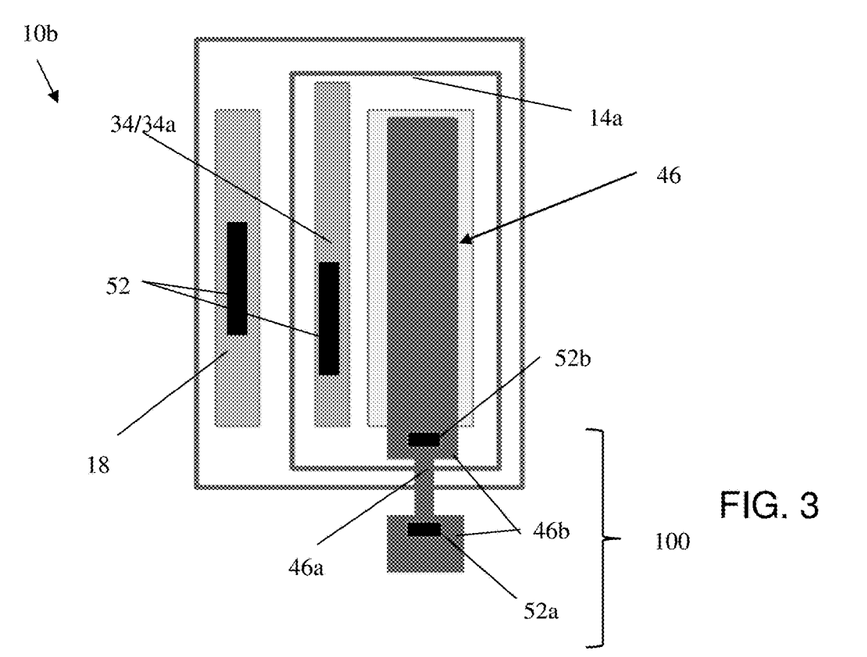
FIG. 3 shows a top view of an e-fuse cell integrated with a bipolar device in accordance with an additional aspect of the present disclosure.
Figure 4:
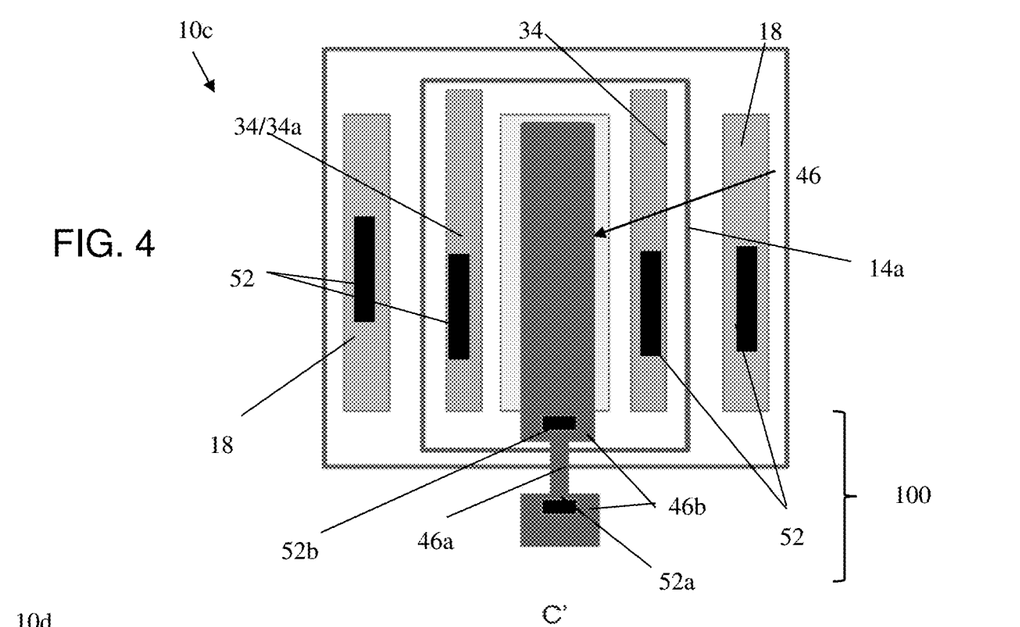
FIG. 4 shows a top view of an e-fuse cell integrated with a bipolar device in accordance with another aspect of the present disclosure.

For example, in FIG. 2, the structure 10a includes the e-fuse 100 located on a side of the emitter region 46, on an opposing side of the contact 52 to the base region 34/34a. In comparison, the structure 10b of FIG. 3 shows the e-fuse 100 below the emitter region 46. In FIG. 4, the structure 10c includes the e-fuse 100 on a bottom side of the emitter region 46. In addition, in FIG. 4, contacts 52 to the base region 34/34a and contacts 52 to the subcollector region 18 are provided on both sides of the emitter region 46. This configuration, for example, can be used for a power amplifier.

Figure 5:
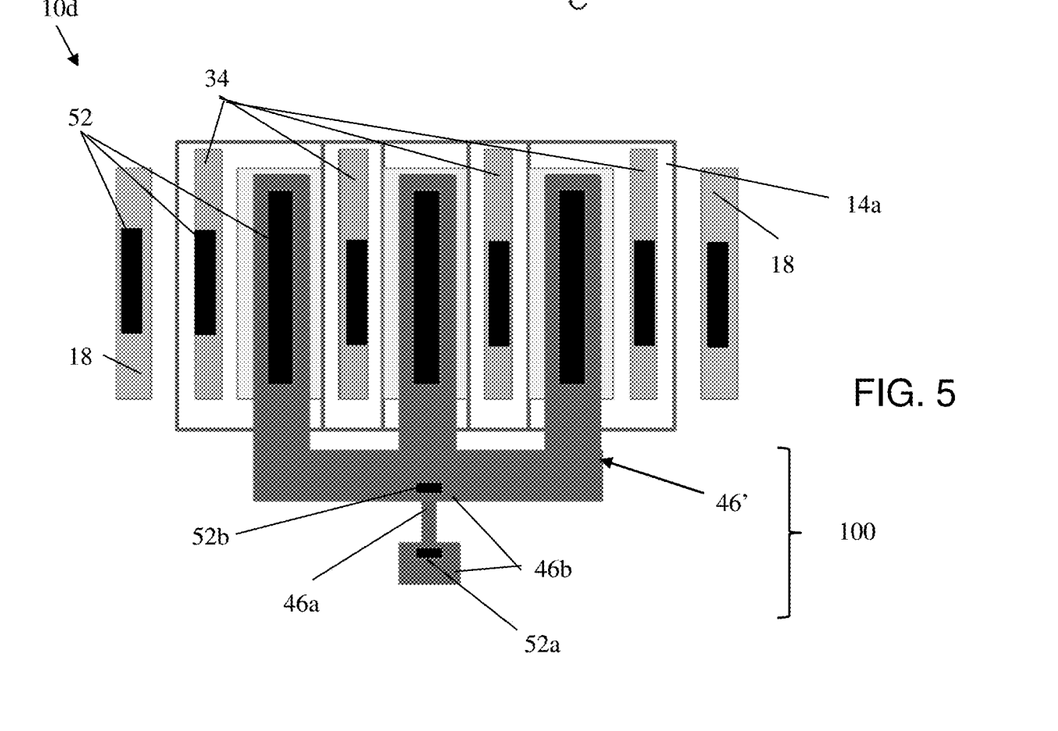
FIG. 5 shows a top view of an e-fuse cell integrated with a bipolar device in accordance with a further aspect of the present disclosure.
Figure 6:
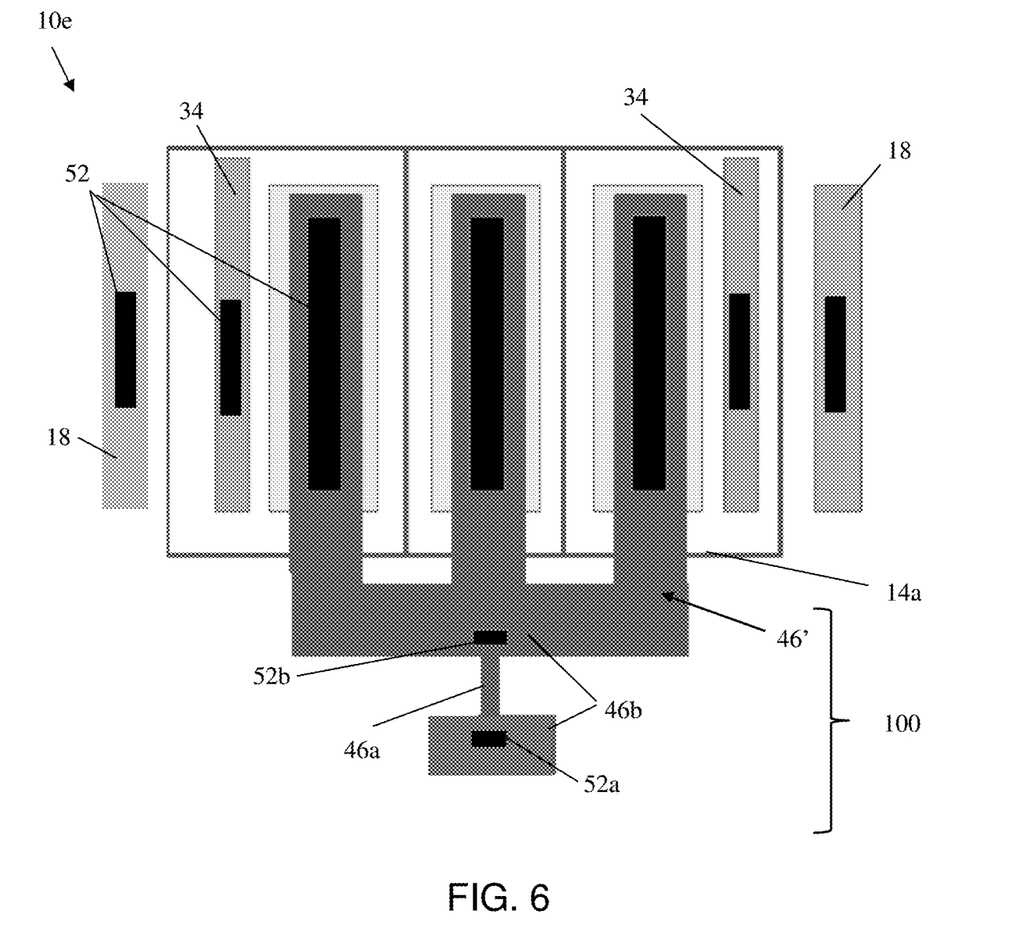
FIG. 6 shows a top view of an e-fuse cell integrated with a bipolar device in accordance with yet an additional aspect of the present disclosure.

In the structure 10d of FIG. 5, the e-fuse 100 can also be located on a bottom side of the emitter region 46. But, in this configuration, the emitter region 46 includes multiple fingers interleaved (e.g., alternating) with contacts 52 to the base regions 34/34a. Moreover, contacts 52 to the subcollector region 18 can be provided on both sides of the emitter region 46. In comparison, in the structure 10e of FIG. 6, the contacts 52 to the base regions 34/34a and contacts 52 to the subcollector region 18 can be provided on both sides of the emitter region 46 (e.g., outside of the multiple fingers).

The integrated e-fuse cells can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a bipolar device comprising a collector region, a base region and an emitter region; and
   an e-fuse integrated with and extending from the emitter region of the bipolar device,
   wherein the e-fuse comprises a silicided center fuse link section narrower than end sections connecting to the silicided center fuse link section.

2. The structure of claim 1, wherein the bipolar device comprises a vertical heterojunction bipolar transistor.

3. The structure of claim 1, wherein the silicided central fuse link section comprising silicided polysilicon material.

4. The structure of claim 1, wherein the e-fuse is laterally integrated with the emitter region of the bipolar device.

5. The structure of claim 1, further comprising interconnects connecting to the end sections, wherein a first of the interconnects comprises a floating interconnect and a second of the interconnects comprises a biasing interconnect.

6. The structure of claim 1, wherein the e-fuse integrated with the emitter region comprises a patterned lateral extension extended from the emitter region with the narrower section comprising a fuse link between two larger out portions.

7. The structure of claim 6, wherein the emitter region comprises a multi-finger emitter region interleaved with contacts to the base region.

8. The structure of claim 6, wherein the emitter region comprises a multi-finger emitter region with contacts to the base region on a side of each outermost finger of the multi-finger emitter region.

9. The structure of claim 6, wherein the contacts to the base region are on opposing sides of the emitter region.

10. A structure comprising:
    a bipolar transistor comprising a collector region, a base region and emitter region, the emitter region comprising a central silicided region substantially narrower than end regions;
    a first interconnect connecting to a first of the end regions; and
    a second interconnect connecting a second of the end regions.

11. The structure of claim 10, wherein the central silicided region comprises a lateral fuse link laterally extending from the emitter region.

12. The structure of claim 10, wherein the central silicided region in combination with the end regions comprise an e-fuse laterally integrated with the emitter region.

13. The structure of claim 12, wherein the central silicided region is devoid of contacts.

14. The structure of claim 12, wherein the first interconnect senses resistance and floats during programming and the second interconnect biases the e-fuse.

15. The structure of claim 12, wherein the bipolar device programs the e-fuse.

16. The structure of claim 10, wherein the bipolar device comprises a vertical heterojunction bipolar transistor.

17. The structure of claim 10, wherein the emitter region comprises a multi-finger emitter region interleaved with contacts to the base region.

18. The structure of claim 10, wherein the emitter region comprises a multi-finger emitter region with contacts to the base region on a side of each outermost finger.

19. A method comprising:
    forming a bipolar device comprising a collector region, a base region and an emitter region; and
    forming an e-fuse integrated with the emitter region of the bipolar device,
    wherein the e-fuse integrated with the emitter region comprises a patterned lateral extension extended from the emitter region with a narrower section comprising a fuse link between two larger out portions.

* * * * *